United States Patent
Johnson et al.

(10) Patent No.: US 6,288,773 B2
(45) Date of Patent: *Sep. 11, 2001

(54) METHOD AND APPARATUS FOR REMOVING RESIDUAL MATERIAL FROM AN ALIGNMENT MARK OF A SEMICONDUCTOR WAFER

(75) Inventors: Gregory A. Johnson; Kunal N. Taravade, both of Colorado Springs, CO (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/210,184

(22) Filed: Dec. 11, 1998

(51) Int. Cl.$^7$ ............ G03B 27/32; G03B 27/52; G01B 11/00; G06K 9/00; G03F 9/00
(52) U.S. Cl. .............. 355/77; 355/30; 355/53; 356/401; 382/151; 382/149; 430/22; 430/30
(58) Field of Search .............. 356/401; 382/151, 382/149; 430/22, 30; 355/30, 53, 77

(56) References Cited

U.S. PATENT DOCUMENTS

| | | | |
|---|---|---|---|
| 4,374,915 | 2/1983 | Ahlquist et al. | 430/22 |
| 4,632,724 | 12/1986 | Chesebro et al. | 156/626 |
| 5,090,482 | * 2/1992 | Baron et al. | 169/46 |
| 5,108,535 | * 4/1992 | Ono et al. | 156/345 |
| 5,271,798 | 12/1993 | Sandhu et al. | 156/638 |
| 5,597,590 | 1/1997 | Tanimoto et al. | 425/174.4 |
| 5,614,446 | 3/1997 | Ramaswami et al. | 437/228 |
| 5,627,110 | 5/1997 | Lee et al. | 438/692 |
| 5,637,966 | * 6/1997 | Umstadter et al. | 315/507 |
| 5,656,229 | 8/1997 | Tanimoto et al. | 264/400 |
| 5,669,979 | * 9/1997 | Elliott et al. | 134/1 |
| 5,705,320 | 1/1998 | Hsu et al. | 430/313 |
| 5,716,873 | 2/1998 | Prall et al. | 437/228 |
| 6,031,598 | * 2/2000 | Tichenor et al. | 355/67 |

* cited by examiner

Primary Examiner—Russell Adams
Assistant Examiner—Khaled Brown

(57) ABSTRACT

A method of exposing an alignment mark defined in a first side of a semiconductor wafer includes the step of engaging a second side of the wafer with a wafer chuck. The method also includes the step of positioning the wafer in a chamber having a photochemical reactant gas present therein during the engaging step. Moreover, the method includes the step of impinging laser beams on the first side of the wafer such that a reactant specie is generated from the photochemical reactant gas. Yet further, the method includes the step of removing material from the first side of the wafer with the reactant specie. An apparatus for exposing an alignment mark defined in a first side of a semiconductor wafer is also disclosed.

25 Claims, 5 Drawing Sheets

METHOD AND APPARATUS FOR REMOVING RESIDUAL MATERIAL FROM AN ALIGNMENT MARK OF A SEMICONDUCTOR WAFER

TECHNICAL FIELD OF THE INVENTION

The present invention relates generally to semiconductor wafer fabrication, and more particularly to a method and apparatus for removing residual material from an alignment mark of a semiconductor wafer.

BACKGROUND OF THE INVENTION

Semiconductor integrated circuits are typically fabricated by a layering process in which several layers of material are fabricated on a surface of a wafer, or alternatively, on a surface of a previous layer. This fabrication process typically requires subsequent layers to be fabricated upon a smooth, planar surface of a previous layer. However, the surface topography of layers may be uneven due to an uneven topography associated with an underlying layer. As a result, a layer may need to be polished in order to present a smooth, planar surface for a subsequent processing step. For example, a layer may need to be polished prior to formation of a conductor layer or pattern on an outer surface of the layer.

In general, a semiconductor wafer may be polished to remove high topography and surface defects such as scratches, roughness, or embedded particles of dirt or dust. The polishing process typically is accomplished with a polishing system that includes top and bottom platens (e.g. a polishing table and a wafer carrier or holder), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate higher removal rates, along with the selective removal of materials fabricated on the semiconductor wafer. This polishing process is often referred to as chemical mechanical planarization or chemical mechanical polishing (CMP).

Such polishing processes typically removes the topographic features of a number of alignment marks associated with the semiconductor wafer. Alignment marks are features such as a number of horizontal and vertical trenches defined in the semiconductor wafer at predetermined locations throughout the wafer which are utilized by fabrication equipment during various steps of wafer fabrication. For example, photolithographic steppers, which pattern images onto the wafer during fabrication thereof, utilize the alignment marks for aligning the semiconductor wafer with a corresponding patterning tool. In particular, prior to imaging a pattern on the semiconductor wafer, the photolithographic stepper aligns a patterning tool associated therewith to the alignment marks by detecting the edges of the alignment marks. It should therefore be appreciated that the alignment marks must be exposed or otherwise clearly defined prior to imaging of a pattern onto the semiconductor wafer.

Traditionally, subsequent to polishing of the semiconductor wafer, the alignment marks are "cleared" or "exposed" by performing a print and etch process in which a layer of resist is initially patterned on the wafer. Thereafter, the wafer is etched by use of an etcher such as a plasma etcher such that material (e.g. residual metal, dielectric, or other debris) in the trenches of the alignment mark is removed from the wafer in the area proximate the alignment mark thereby exposing or otherwise clearing the alignment mark for subsequent use thereof.

A plasma etcher typically consists of a vacuum chamber having a reactant gas present therein. A semiconductor wafer is positioned on an alignment mechanism so as to be positioned or aligned in a predetermined orientation. Thereafter, the semiconductor wafer is positioned within the vacuum chamber by a robotic arm mechanism. Application of an electric field within the vacuum chamber (e.g. an electric field at either RF or microwave frequencies) causes the reactant gas to be broken down thereby generating a plasma. Reactant species present in the plasma etch or otherwise remove the wafer material that is intended to be removed (i.e. material not covered or otherwise layered with a resist layer). Hence, in regard to fabrication methods which have heretofore been utilized to clear alignment marks, a resist layer is initially patterned on the wafer such that the areas proximate the alignment marks are exposed or otherwise not covered by the resist layer. Thereafter, the wafer is etched in the plasma etcher such that the material disposed on the alignment mark is etched by the plasma present in the vacuum chamber.

However, the above-described prior art method of clearing alignment marks has a number of drawbacks associated therewith. For example, the above-described prior art method of clearing alignment marks undesirably requires a printing step for printing a masking layer onto the wafer prior to the etching step associated with clearing the alignment marks. Such an additional step undesirably increases costs associated with manufacture of the semiconductor wafer.

Thus, a continuing need exists for a method and an apparatus which accurately and efficiently removes residual material or debris from an alignment mark subsequent to polishing of a semiconductor wafer. What is specifically needed is a method and an apparatus which accurately and efficiently removes material from an alignment mark subsequent to polishing of a semiconductor wafer which reduces the number of fabrication steps relative to prior art methods and apparatuses for removing material from an alignment mark.

SUMMARY OF THE INVENTION

In accordance with one embodiment of the present invention, there is provided a method of exposing an alignment mark of a semiconductor wafer. The method includes the step of exposing at least a portion of the wafer to a photochemical reactant gas. The method also includes the step of impinging light beams on the wafer such that a reactant specie is generated from the photochemical reactant gas. Moreover, the method includes the step of removing material from the wafer with the reactant specie so as to expose said alignment mark.

Pursuant to another embodiment of the present invention, there is provided a method of exposing an alignment mark defined in a first side of a semiconductor wafer. The method includes the step of engaging a second side of the wafer with a wafer chuck. The method also includes the step of positioning the wafer in a chamber having a photochemical reactant gas present therein during the engaging step. Moreover, the method includes the step of impinging laser beams on the first side of the wafer such that a reactant specie is generated from the photochemical reactant gas. Yet further, the method includes the step of removing material from the first side of the wafer with the reactant specie so as to expose the alignment mark.

Pursuant to yet another embodiment of the present invention, there is provided an apparatus for exposing an alignment mark defined in a first side of a semiconductor wafer. The apparatus includes a chamber having a photochemical reactant gas present therein. The apparatus also includes a wafer chuck configured to engage the wafer by a second side of the wafer so as to position the wafer within the chamber. Moreover, the apparatus includes a light source unit positioned such that light beams generated by the light source unit are impinged on the first side of the wafer when the wafer is positioned within the chamber. Impingement of the light beams on the first side of the wafer causes a reactant specie to be generated from the photochemical reactant gas so as to remove material from the first side of the wafer thereby exposing the alignment mark.

It is an object of the present invention to provide an improved method and apparatus for exposing an alignment mark of a semiconductor wafer.

It is an object of the present invention to provide a new and useful method and apparatus for exposing an alignment mark of a semiconductor wafer.

It is a further object of the present invention to provide a method and apparatus for exposing an alignment mark of a semiconductor wafer which requires fewer processing steps relative to heretofore designed methods and apparatuses.

It is moreover an object of the present invention to provide an apparatus for exposing an alignment mark of a semiconductor wafer which is less mechanically complex relative to etching apparatuses which have heretofore been designed.

The above and other objects, features, and advantages of the present invention will become apparent from the following description and the attached drawings.

DETAILED DESCRIPTION OF A PREFERRED EMBODIMENT

Figure 1:
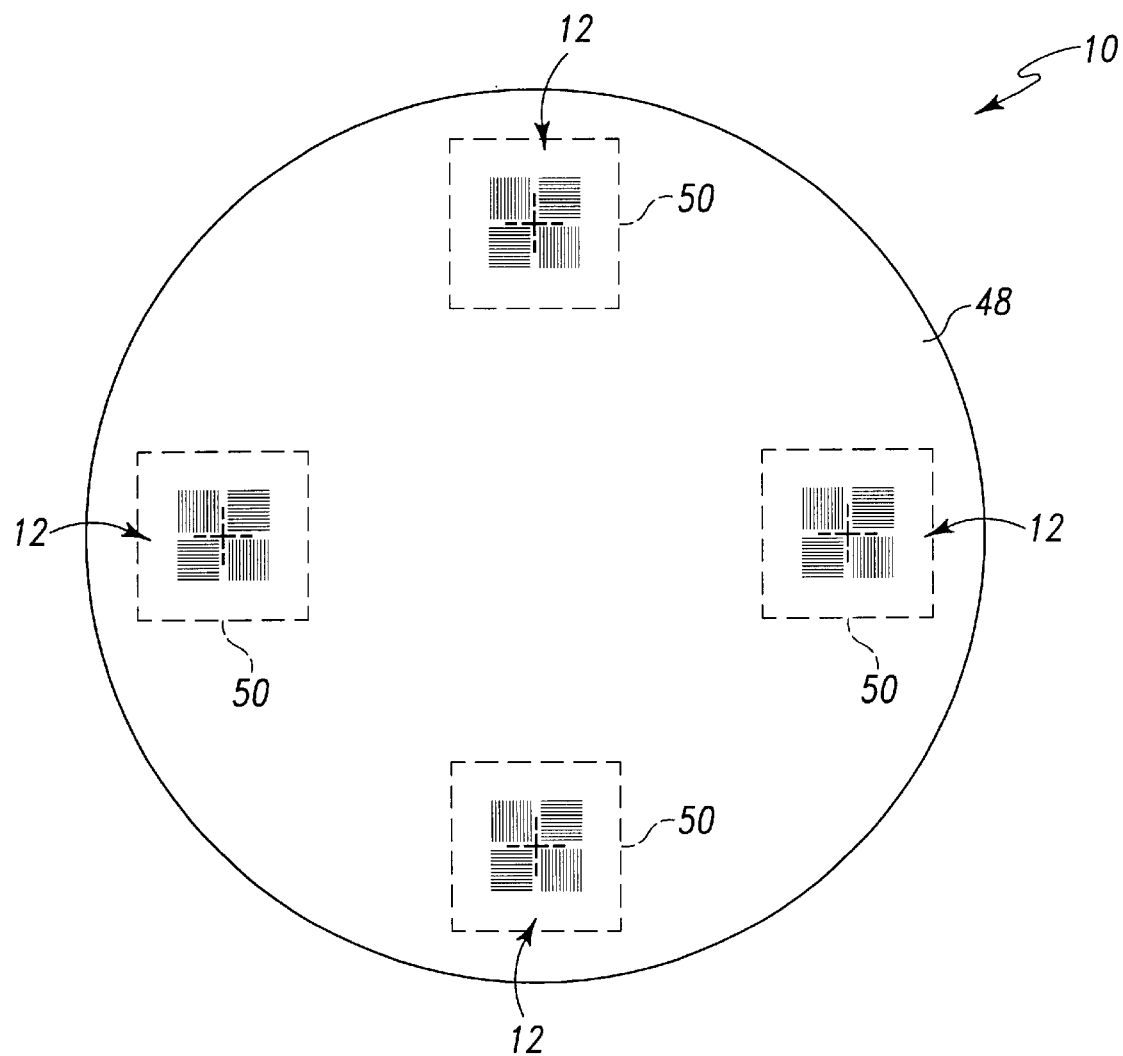
FIG. 1 is a plan view of a semiconductor wafer which shows the location of the alignment marks which are utilized during fabrication of the wafer, note that the alignment marks have been enlarged for clarity of description.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 2:
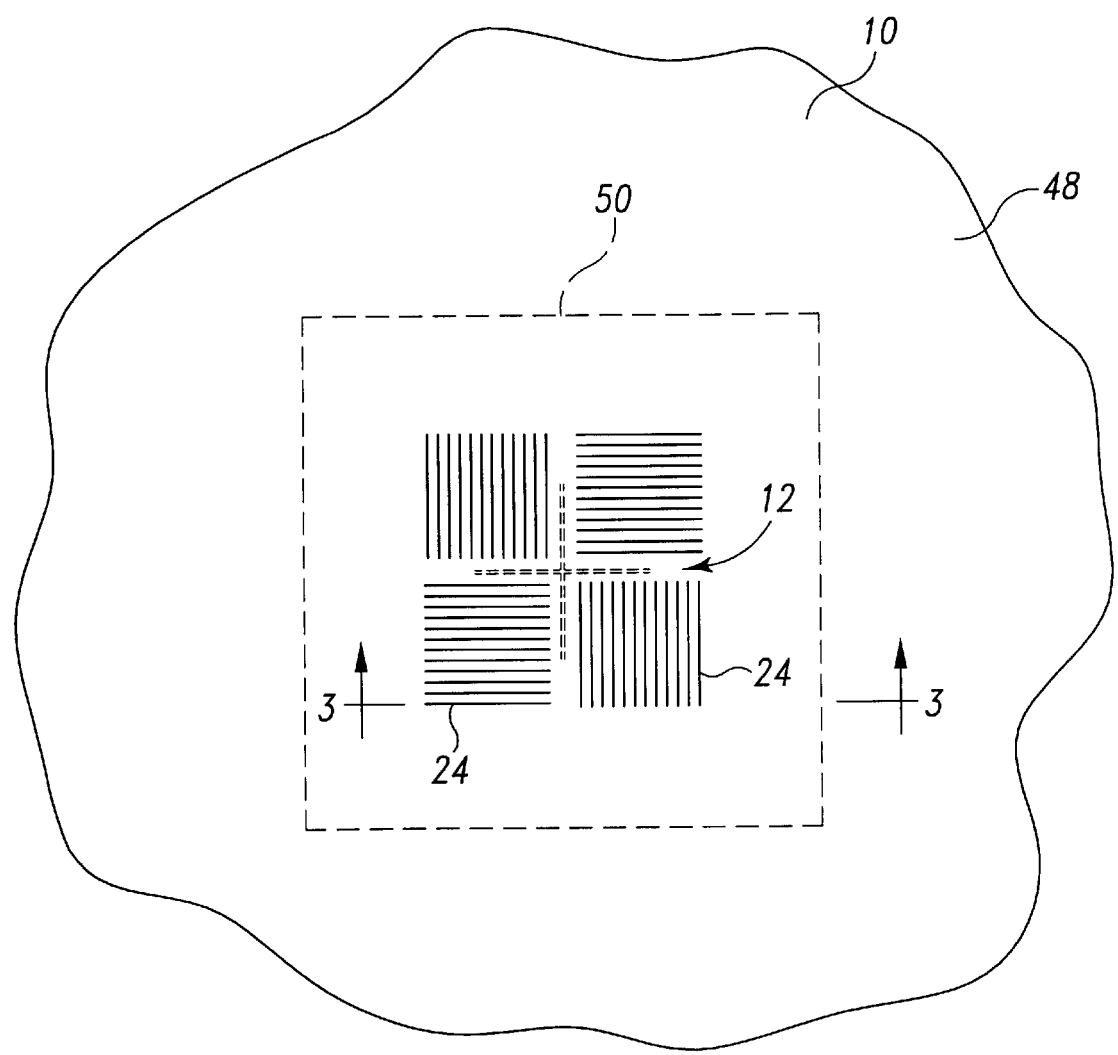
FIG. 2 is an enlarged fragmentary view of the semiconductor wafer of FIG. 1 showing one of the alignment marks in greater detail.

Referring now to FIGS. 1–3, there is shown a semiconductor wafer 10 which has a number of alignment marks 12 defined therein. The alignment marks 12 are utilized by various types of manufacturing equipment during fabrication of the semiconductor wafer 10. For example, the alignment marks 12 may be utilized to align the semiconductor wafer 10 in a photolithographic stepper during patterning of a metal layer. Note that in FIG. 1, the semiconductor wafer 10 is shown having four alignment marks 12. However, the semiconductor wafer 10 may be configured to include any number of alignment marks to fit the particular needs of a given manufacturing process.

Each of the alignment marks 12 includes a pattern of horizontal and vertical lines and spaces which are defined in certain layers of the semiconductor wafer 10. In particular, the semiconductor wafer 10 includes a semiconductor substrate 14, such as silicon. The semiconductor substrate 14 has a number of horizontal and vertical trenches 16 etched therein (see FIG. 3A). An oxide layer 18 (e.g. silicon oxide) and a nitride layer 20 (e.g. silicon nitride) are then deposited or otherwise disposed on the semiconductor substrate 14 (see FIGS. 3B and 3C). In particular, the fabrication process deposits the oxide layer 18 on the semiconductor substrate 14 such that a corresponding number of horizontal and vertical trenches 22 are defined in the semiconductor wafer 10 at a location above the semiconductor substrate 14. Moreover, the fabrication process deposits the nitride layer 20 on the oxide layer 18 such that a corresponding number of horizontal and vertical trenches 24 are defined in the semiconductor wafer 10 at a location above the oxide layer 18 (and hence the semiconductor substrate 14). As a result, the horizontal and vertical trenches 24 of the alignment marks 12 define a pattern which may be utilized by fabrication equipment (e.g. a photolithographic stepper) to align the semiconductor wafer 10 during subsequent processing thereof. It should be appreciated that numerous other conformal layers such as additional oxide or nitride layers or a conformal metal layer may be deposited on the nitride layer 20 so long as subsequent horizontal and vertical trenches are fabricated to function as the alignment marks 12.

Figure 3A:
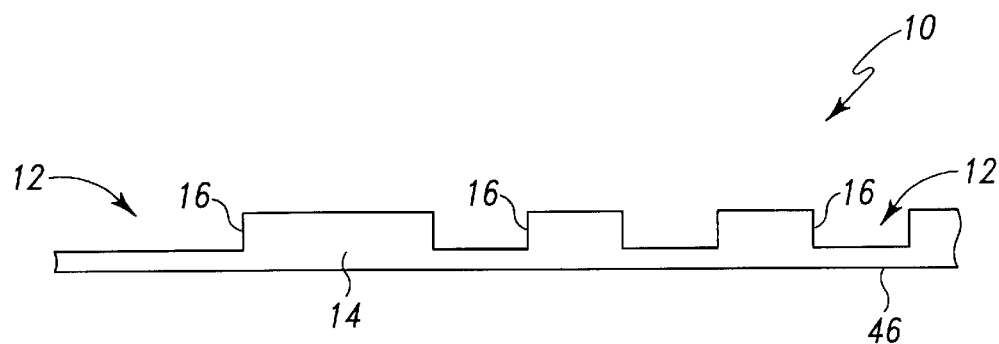
FIGS. 3A–3E are fragmentary cross sectional views of the semiconductor wafer of FIG. 1 taken along the line 3—3 of FIG. 2 (as viewed in the direction of the arrows) during various steps of fabrication of the wafer.
Figure 3B:
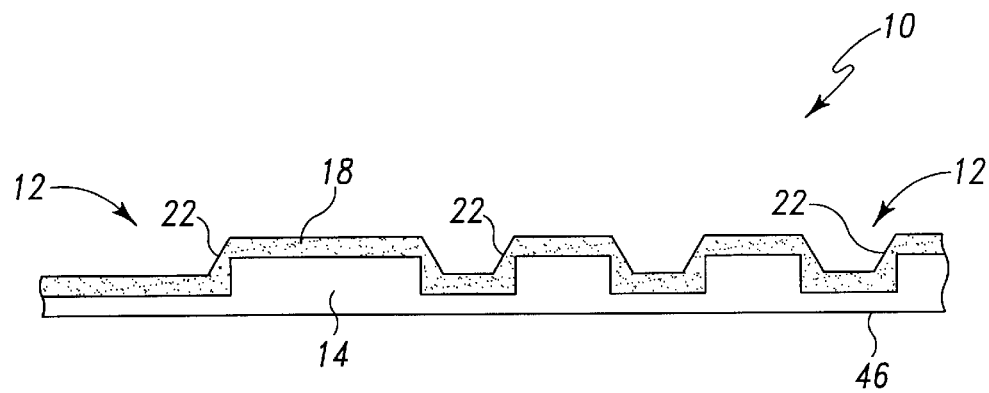
Figure 3C:
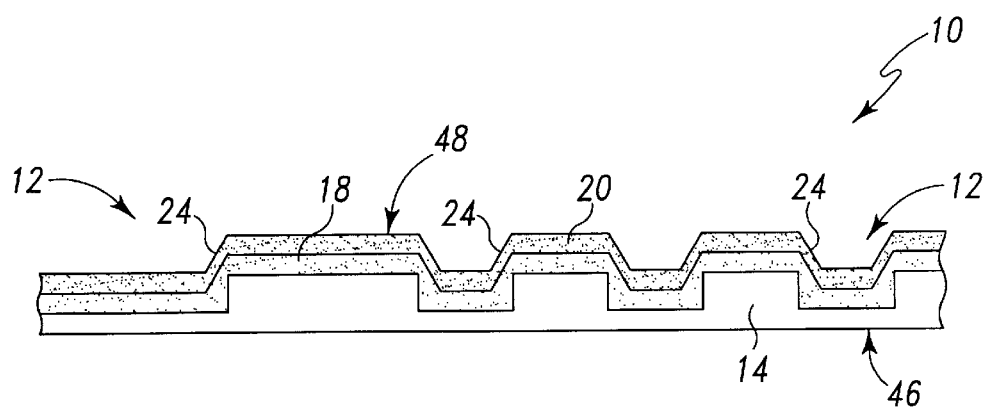
Figure 3D:
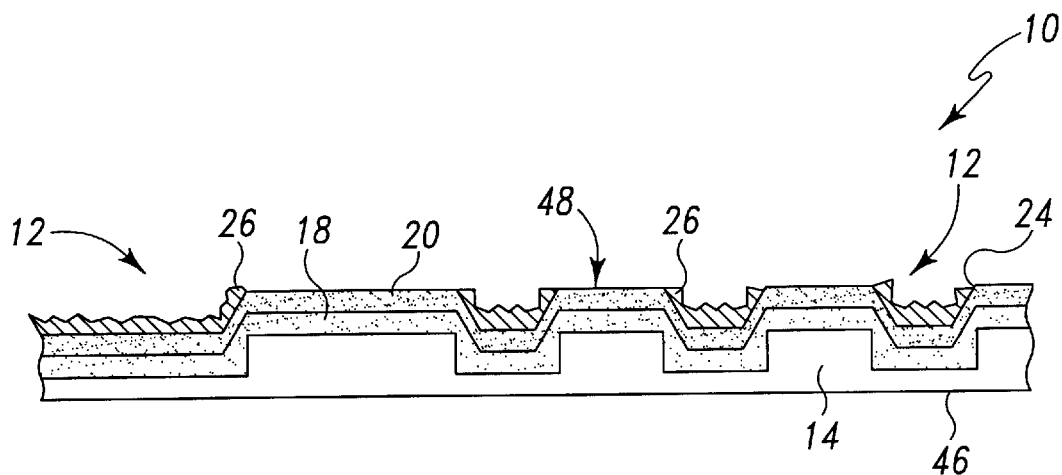

As shown in FIG. 3D, residual material or debris 26 such as metal residue from a metal layer or dielectric residue from a dielectric layer may accumulate or otherwise be deposited in the horizontal and vertical trenches associated with the alignment marks 12 (e.g. the trenches 24 in the case of where the nitride layer 20 is the outer layer of the alignment marks 12). It should be appreciated that such accumulation of debris 26 may be the result of a previous polishing step (e.g. CMP) in the fabrication process. Moreover, accumulation of such debris 26 reduces or eliminates the effectiveness of the alignment marks 12 in facilitating alignment of the semiconductor wafer 10 in fabrication equipment (e.g. a photolithographic stepper). In particular, such debris 26 may cause misalignment of the semiconductor wafer 10 thereby potentially causing manufacturing defects (e.g. printing defects).

Figure 4:
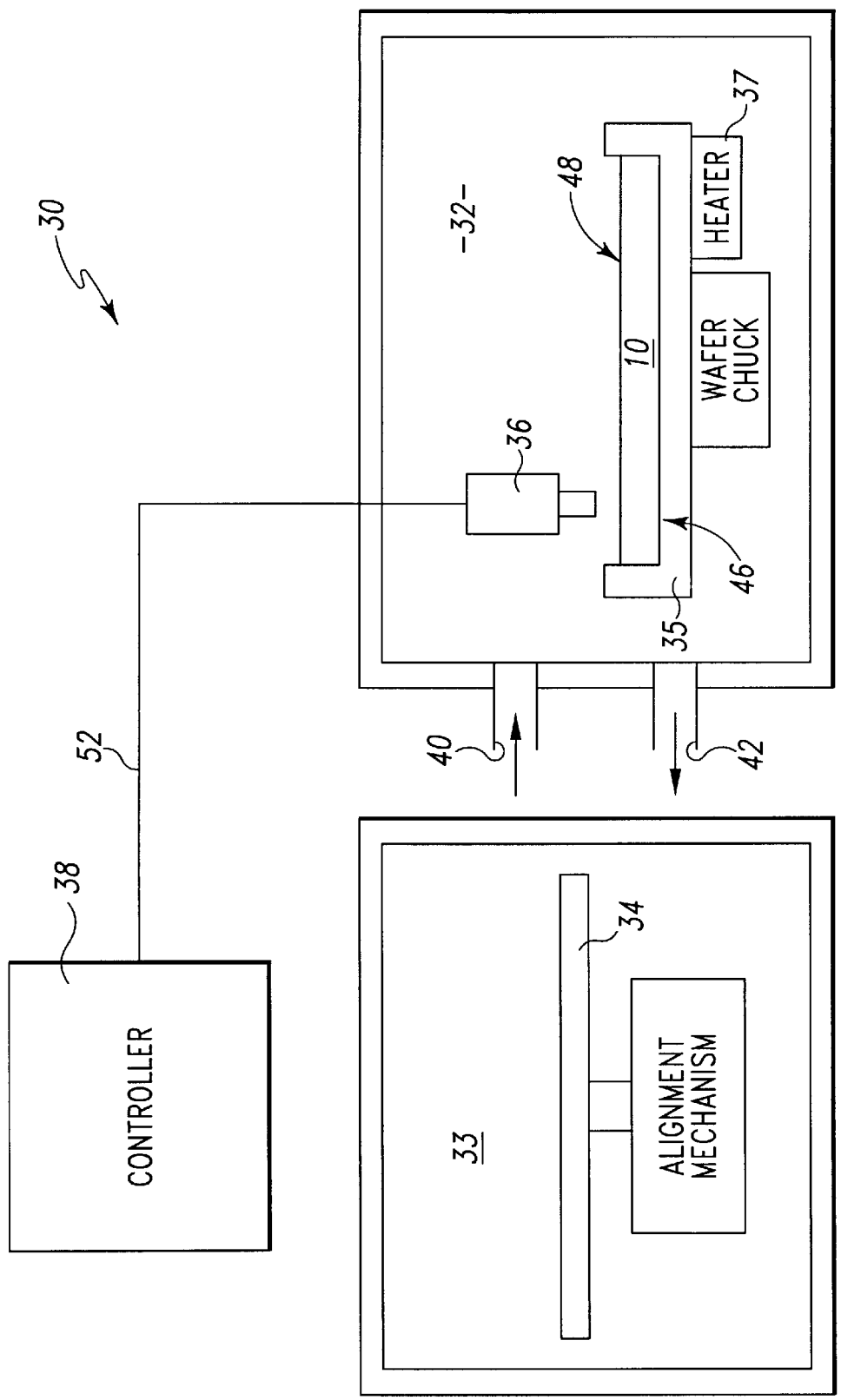
FIG. 4 a diagrammatic view showing an etching system which incorporates the features of the present invention therein.

In order to remove the debris 26 from the trenches 24 so as to expose the alignment marks 12, an etching system 30 (see FIG. 4) according to the present invention etches or otherwise removes the debris 26 from the alignment marks 12. What is meant herein by the phrases "expose the alignment mark" or "exposing the alignment mark" is debris removal to the extent that the debris is substantially removed from the horizontal and vertical trenches associated with the alignment mark such that the alignment mark is detectable or otherwise suitable for use by fabrication equipment (e.g. a photolithographic stepper) during fabrication of the semiconductor wafer.

The etching system 30 includes a vacuum chamber 32, an alignment chamber 33, an alignment device or mechanism 34, a wafer chuck 35, a light source unit 36, and a controller 38. The alignment mechanism 34 is positioned in the alignment chamber 33. The alignment mechanism 34 of the present invention is preferably configured as a coarse alignment mechanism which has an alignment accuracy of one millimeter (i.e. ±1 mm) of its target. Examples of an alignment mechanism which is suitable for use as the alignment mechanism 34 of the present invention include the coarse alignment mechanism included in a model number 9600 plasma etching system which is commercially available from LAM Research Corporation of Fremont, Calif. or the coarse alignment mechanism included in a Centura model plasma etching systems which are commercially available from Applied Materials of Santa Clara, Calif. Once the semiconductor wafer 10 has been aligned by the alignment mechanism 34, a carrier device such as a robotic arm mechanism or the like (not shown) transfers the semiconductor wafer 10 from the alignment chamber 33 to the vacuum chamber 32. In particular, once the semiconductor wafer 10 has been aligned by the alignment mechanism 34, a robotic arm mechanism (not shown) removes the semiconductor wafer 10 from the alignment mechanism 34 and hence the alignment chamber 33, and thereafter places the semiconductor wafer 10 in the wafer chuck 35 within the vacuum chamber 32.

The vacuum chamber 32 has an inlet 40 which is fluidly coupled to a gas source (not shown) in order to provide for a flow of a photochemical reactant gas or gases into the vacuum chamber 32. The photochemical reactant gas may be any gas or mixture of gases which is utilized to etch wafer material in the presence of energy such as the energy supplied by the light source unit 36. Examples of photochemical reactant gases include $ClF_3$, $F_2$, $BrF_3$, $Cl_2$, or combinations thereof such as $ClF_3/Cl_2$ and $F_2/Cl_2$. Such reactant gases, particularly when used in conjunction with a carrier gas such as $N_2$, have been found to be particularly useful when etching oxides and nitrides. Other combinations of gases which may be utilized as a reactant gas of the present invention in order to etch oxides and nitrides include $CF_4/CHF_3$, $C_2F_6/CHF_3$, $CF_4/O_2$, $C_2F_6$, $SF_6/He$, and $SF_6/HBr/O_2$. Other combinations of gases which may be utilized as a reactant gas of the present invention in order to etch polysilicon or metals include $Cl_2/HBr/He$ and $Cl_2/BCl_3$. It should be noted that each of the above-mentioned combinations may also be utilized in conjunction with a carrier gas such as Ar or $N_2$. It should be appreciated that the above-mentioned photochemical reactant gases, and the combinations thereof, are exemplary in nature and that numerous other photochemical reactant gases may also be utilized to fit the needs of a given etching system 30.

The vacuum chamber 32 also has an outlet 42 which is fluidly coupled to a vacuum pump (not shown) in order to selectively reduce pressure within the vacuum chamber 32 to a predetermined pressure level. One vacuum chamber (and associated components) which is suitable for use as the vacuum chamber 32 of the present invention is the model number 9600 plasma etching system from LAM Research. Other suitable vacuum chambers (and associated components) which are suitable for use as the vacuum chamber 32 of the present invention are the model number P5000 and the Centura model plasma etching systems from Applied Materials.

The wafer chuck 35 is configured to retain the semiconductor wafer 10. In particular, the wafer chuck 35 includes retaining mechanisms (not shown) for holding a back side 46 (see FIGS. 3A–3E) of the semiconductor wafer 10. For example, the wafer chuck 35 may include a clamp ring assembly (not shown) for retaining the semiconductor wafer 10.

Moreover, the wafer chuck 35 has a heating device 37 associated therewith. The heating device 37 is provided to heat the semiconductor wafer 10. In particular, the heating device 37 heats the semiconductor wafer 10 to a predetermined temperature in order to provide energy which is utilized in conjunction with the energy provided by the light beams generated by the light source unit 36 in order to generate the reactant specie from the photochemical reactant gas. In such an arrangement, temperature within the vacuum chamber 32 may be maintained within a predetermined operating range so as to facilitate etching of the semiconductor wafer 10. For example, during etching of the semiconductor wafer 10, temperature within the vacuum chamber is maintained above zero degrees Celsius (0° C.).

The light source unit 36 is electrically coupled to the controller 38 via a signal line 52 and is positioned such that light beams generated by the light source unit 36 are impinged or otherwise directed on a front side 48 of the semiconductor wafer 10 when the wafer 10 is positioned in the vacuum chamber 32. Moreover, the light source unit 36 is configured to impinge light beams on a localized portion of the front side 48 of the semiconductor wafer 10. In particular, the light source unit 36 includes beam positioning, focusing, and scanning optics (not shown) such that light beams may be scanned on the front side 48 of the semiconductor wafer 10 at predetermined locations thereof. For example, the light source unit 36 is preferably configured as a raster scanning light source unit which is capable of raster scanning light beams on a localized portion of the front side 48 of the semiconductor wafer 10. What is meant herein by the term "localized portion" is a relatively small portion of the total surface area of the front side 48 of the semiconductor wafer 10. Examples of localized portions of the front side 48 of the semiconductor wafer 10 include the alignment marks 12 themselves, or a 'clear-out' portion 50 (see FIG. 1) surrounding each of the alignment marks 12. Such clear-out portions typically have a width of 2–3 millimeters.

The light source unit 36 may be configured as one of numerous types of light source units. For example, the light source unit 36 may be configured as a scanning mercury-arc lamp which is capable of raster or otherwise scanning ultraviolet (UV) light beams on localized portions (e.g. the alignment marks 12) of the front side 48 of the semiconductor wafer 10. Moreover, the light source unit 36 may be configured as a laser raster scanner which is capable of raster scanning laser beams on localized portions (e.g. the alignment marks 12) of the front side 48 of the semiconductor wafer 10. One such laser raster scanner which is suitable for use as the light source unit 36 of the present invention is an Alta 3500 Raster Scanner which is commercially available from Etec Systems, Incorporated of Hayward, Calif. It should be appreciated that the light source unit 36 may be embodied as numerous types of light source units in addition to a UV or laser light source units and may be operated to produce light at various wavelengths.

Light beams (e.g. laser or UV) generated by the light source unit 36 cause selective etching of localized portions of the front side 48 of the semiconductor wafer 10. Hence, light beams (e.g. laser or UV) generated by the light source unit 36 may be utilized to cause selective etching of all or part of the clear-out portions 50 of the front side 48 of the semiconductor wafer 10 thereby exposing the alignment marks 12 therein. In particular, when the semiconductor wafer 10 is positioned in the vacuum chamber 32 in the presence of the photochemical reactant gas (or gases), light beams generated by the light source unit 36 provide the energy necessary to break down the photochemical reactant gas in the area proximate the localized portion of the wafer 10 thereby causing a reactant specie to be generated from the photochemical reactant gas. The reactant specie in turn causes etching (i.e. removal) of material within the localized portion of the wafer 10. Hence, in the case of where the localized portion is selected to be all or part of each of the clear-out portions 50, the reactant specie generated by the breakdown of the photochemical reactant gas by the light beams impinging on the clear-out portion 50 etches the debris 26 (see FIG. 3D) deposited in the horizontal and vertical trenches (e.g. the trenches 24) thereby exposing the alignment marks 12.

It should be appreciated that the light source unit 36 may be operated to scan the localized portion (e.g. each of the clear-out portions 50) of the wafer 10 for a predetermined period of time in order to etch the front side 48 of the wafer 10 for an amount of time necessary to remove substantially all of the desired material (e.g. the debris 26). For example, in the case of when the light source unit 36 is embodied as a laser raster scanner, the controller 38 controls the laser raster scanner 36 via the signal line 52 such that the laser raster scanner 36 scans all or a portion of each of the clear-out portions 50 for a predetermined period of time. During such a predetermined period of time, laser beams generated by the laser raster scanner 36 are impinged on the clear-out portions 50 of the front side 48 of the wafer 10 such that material (e.g. the debris 26) is removed from the front side 48 of the wafer 10 within the clear-out portion 50 (including the horizontal and vertical trenches associated with the alignment marks 12) by the reactant specie generated by presence of the energy from the laser beams. After the predetermined period of time, the controller 38 communicates with the laser raster scanner 36 such that the scanner 36 is deactuated thereby causing the scanner 36 to cease to emit laser beams which in turns ceases generation of reactant specie from the photochemical reactant gas. It should be appreciated that the wafer 10 ceases to be etched in the localized portion (e.g. the clear-out portion 50), or anywhere else for that matter, when reactant specie generation is ceased. It should be noted that the duration of the predetermined time period is selected to be long enough to adequately clear the debris 26 from the alignment marks 12, yet not so long as to cause excessive etching of either the oxide layer 18 or the nitride layer 20. Moreover, the type of photochemical reactant gas utilized within the vacuum chamber 32 may also be selectively chosen so as to eliminate or reduce the amount of etching of the oxide layer 18 or the nitride layer 20 which occurs during clearing of the alignment marks 12 in the manner discussed above.

Moreover, it should be further appreciated that the light source unit 36 may be operated to generate light beams either continuously or may alternatively pulse light beams onto the front side 48 of the semiconductor wafer 10. Yet further, as alluded to above, the light source unit 36 may also be configured with a number of convex lenses or the like for focusing the light beams from the light source unit 36 onto the front side 48 of the semiconductor wafer 10. It should be appreciated that such focusing increases the intensity of the light beams thereby increasing the reaction rate associated with the photochemical reactant gas.

In operation, during fabrication of the semiconductor wafer 10, the etching system 30 may be utilized to clear debris 26 from horizontal and vertical trenches associated with the alignment marks 12 thereby exposing the alignment marks 12. In particular, subsequent to polishing (e.g. CMP) of the semiconductor wafer 10, debris such as residual metal or dielectric may be deposited in the trenches associated with the alignment marks 12. Hence, in order to expose or clear the alignment marks 12, the semiconductor wafer 10 is first positioned in the alignment chamber 33 so as to be aligned by the coarse alignment mechanism 34. Once aligned, the semiconductor wafer 10 is transferred so as to be positioned in the wafer chuck 35 within the vacuum chamber 32.

Once positioned in the vacuum chamber 32, the semiconductor wafer 10 is exposed to a photochemical reactant gas or gases. In particular, photochemical reactant gas is advanced from a gas source (not shown) into the vacuum chamber 32 via the inlet 40. Note that the vacuum pump (not shown) coupled to the outlet 42 maintains pressure within the vacuum chamber 32 at a predetermined pressure level.

Figure 3E:
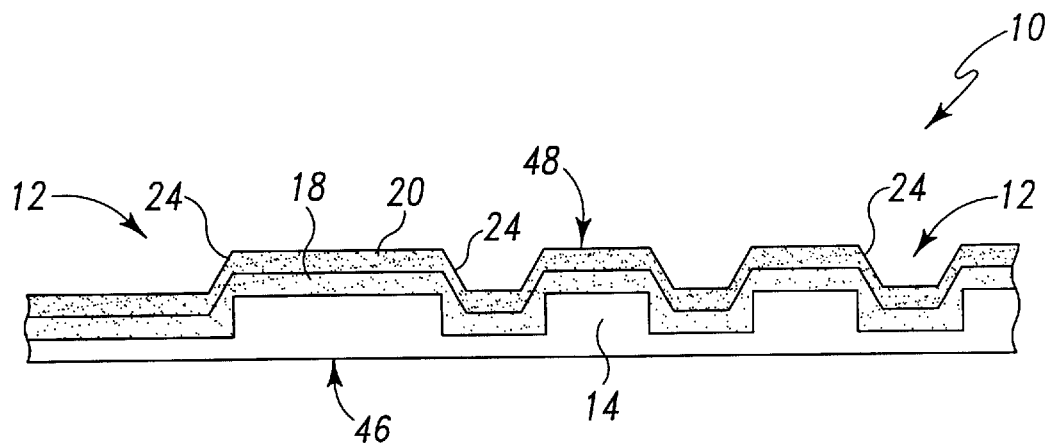

In the presence of the photochemical reactant gas, the light source unit 36 generates light beams (e.g. laser or UV light beams) which are utilized to cause selective etching of all or part of each of the clear-out portions 50 of the front side 48 of the semiconductor wafer 10 in order to remove the debris 26 from the horizontal and vertical trenches associated with the alignment marks 12. In particular, when the semiconductor wafer 10 is positioned in the vacuum chamber 32 in the presence of the photochemical reactant gas, light beams generated by the light source unit 36 are scanned on the front side 48 of the semiconductor wafer 10 over all or a portion of each of the clear-out portions 50. The scanning light beams provide the energy necessary to break down the photochemical reactant gas in the area proximate the clear-out portions 50 thereby causing a reactant specie to be generated from the photochemical reactant gas. Such reactant specie generation selectively etches the debris 26 (see FIG. 3D) deposited in the horizontal and vertical trenches thereby exposing the alignment marks 12 (as shown in FIG. 3E). It should be appreciated that each of the remaining alignment marks 12 of the semiconductor wafer 10 are then exposed or otherwise cleared in a similar manner.

It should be appreciated that once each of the alignment marks 12 has been exposed in the manner described above, the semiconductor wafer 12 may be advanced to subsequent wafer fabrication processes. For example, once the alignment marks 12 have been cleared or otherwise exposed by use of the etching system 30, the wafer 10 may have a pattern associated with a metal layer printed thereon by use of a photolithographic stepper.

Hence, as described above, the etching system 30 provides numerous advantages over systems which have heretofore been designed for the purpose of clearing alignment marks. For example, the etching system 30 of the present invention may be utilized to clear or otherwise expose the alignment marks 12 of the wafer 10 in fewer steps relative to systems which have heretofore been designed. In particular, the etching system 30 of the present invention does not require the semiconductor wafer 10 to have a resist pattern printed or otherwise disposed thereon prior to etching of the alignment marks 12.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

For example, it should be appreciated that the light source unit 36 may alternatively be positioned outside of the vacuum chamber 32 such that light signals generated by the light source unit 36 are first directed through a sapphire window or the like positioned in an upper wall of the vacuum chamber 32 and thereafter impinged upon the front side 48 of the semiconductor wafer 10.

In addition, it should be appreciated that the wafer chuck 35 may be configured so as to be movable to a number of locations within the vacuum chamber 32 under the control of the controller 38. In such an arrangement, the clear out portions 50 of the semiconductor wafer 10 may be selectively positioned under the light source unit 36 thereby allowing the light source unit 36 to be configured without positioning optics.

What is claimed is:

1. A method of exposing an alignment mark of a semiconductor wafer, comprising the steps of:

exposing at least a portion of said wafer to a photochemical reactant gas;

configuring a light source unit so that light beams generated by said light source unit are only impinged on a localized portion of said wafer such that a reactant specie is generated from said photochemical reactant gas;

impinging said light beams only on said localized portion of said wafer; and removing material from said localized portion of said wafer with said reactant specie so as to expose said alignment mark.

2. The method of claim 1, wherein said step of impinging light beams on said wafer includes the step of impinging laser beams on said wafer such that said reactant specie is generated from said photochemical reactant gas.

3. The method of claim 2, wherein said step of impinging laser beams on said wafer includes the step of raster scanning said laser beams on said wafer such that said reactant specie is generated from said photochemical reactant gas.

4. The method of claim 1, wherein said step of impinging light beams on said wafer includes the step of impinging UV light beams on said wafer from a mercury-arc lamp such that said reactant specie is generated from said photochemical reactant gas.

5. The method of claim 4, wherein said step of impinging UV light beams on said wafer includes the step of raster scanning said UV light beams on said wafer such that said reactant specie is generated from said photochemical reactant gas.

6. The method of claim 1, wherein said step of impinging light beams on said wafer includes the step of impinging light beams on said wafer such that said reactant specie is generated from said photochemical reactant gas for a predetermined period of time, further comprising the step of:

ceasing to impinge light beams on said wafer after said predetermined period of time such that said reactant specie ceases to be generated from said photochemical reactant gas, whereby said material ceases to be removed from said wafer when said reactant specie ceases to be generated from said photochemical reactant gas.

7. The method of claim 1, further comprising the step of:

positioning said wafer in a wafer chuck having a heating device associated therewith; and heating said wafer with said heating device associated with said wafer chuck prior to said impinging step.

8. A method of exposing an alignment mark defined in a first side of a semiconductor wafer, comprising the steps of:

engaging a second side of said wafer with a wafer chuck;

positioning said wafer in a chamber having a photochemical reactant gas present therein during said engaging step;

configuring a light source unit so that laser beams generated by said light source unit are only impinged on a localized portion of said first side of said wafer such that a reactant specie is generated from said photochemical reactant gas;

impinging said laser beams only on said localized portion of said wafer; and removing material from said localized portion of said first side of said wafer with said reactant specie so as to expose said alignment mark.

9. The method of claim 8, wherein said impinging step includes the step of raster scanning said laser beams on said first side of said wafer such that said reactant specie is generated from said photochemical reactant gas.

10. The method of claim 8, wherein said impinging step includes the step of impinging laser beams on said first side of said wafer such that said reactant specie is generated from said photochemical reactant gas for a predetermined period of time, further comprising the step of:

ceasing to impinge laser beams on said wafer after said predetermined period of time such that said reactant specie ceases to be generated from said photochemical reactant gas, whereby said material ceases to be removed from said wafer when said reactant specie ceases to be generated from said photochemical reactant gas.

11. The method of claim 8, further comprising the step of:

positioning said wafer in a wafer chuck having a heating device associated therewith; and heating said wafer with said heating device associated with said wafer chuck prior to said impinging step.

12. An apparatus for exposing an alignment mark defined in a first side of a semiconductor wafer, comprising:

a chamber having a photochemical reactant gas present therein;

a wafer chuck configured to engage said wafer by a second side of said wafer so as to position said wafer within said chamber; and a light source unit configured such that light beams generated by said light source unit are only impinged on a localized portion of said first side of said wafer when said wafer is positioned within said chamber, wherein (i) said wafer chuck and said wafer are positioned relative to said light source so that said light beams are only impinged on said localized portion of said first side of said wafer and (ii) impingement of said light beams on said first side of said wafer causes a reactant specie to be generated from said photochemical reactant gas so as to remove material from said localized portion of said first side of said wafer thereby exposing said alignment mark.

13. The apparatus of claim 12, wherein said light source unit includes a laser source unit positioned such that laser beams generated by said laser source unit are impinged on said first side of said wafer when said wafer is positioned within said chamber.

14. The apparatus of claim 13, wherein:

said laser source unit includes a raster scanning laser source unit, and said raster scanning laser source unit is configured to scan said laser beams on said first side of said wafer when said wafer is positioned in said chamber.

15. The apparatus of claim 12, wherein said light source unit includes a mercury-arc lamp positioned such that UV light beams generated by said mercury-arc lamp are impinged on said first side of said wafer when said wafer is positioned within said chamber.

16. The apparatus of claim 15, wherein:

said mercury-arc lamp includes a raster scanning mercury-arc lamp, and said raster scanning mercury-arc lamp is configured to scan said UV light beams on said first side of said wafer when said wafer is positioned in said chamber.

17. The apparatus of claim 12, further comprising a controller electrically coupled to said light source unit, wherein:

said controller is configured to (i) cause said light source unit to impinge said light beams on said first side of said wafer such that said reactant specie is generated from said photochemical reactant gas during a first period of time, and (ii) cause said light source unit to cease impingement of said light beams on said wafer such that said reactant specie ceases to be generated from said photochemical reactant gas during a second period of time, and said material ceases to be removed from said first side of said wafer during said second period of time.

18. The apparatus of claim 12, wherein:

said wafer chuck has a heating device associated therewith, and said wafer chuck is configured to heat said wafer with said heating device prior to impingement of said light beams on said front side of said wafer when said wafer is positioned in said wafer chuck.

19. The apparatus of claim 12, wherein temperature in said chamber is maintained above zero degrees Celsius when said wafer is positioned in said chamber.

20. The method of claim 1, wherein:

said localized portion of said wafer includes a clear-out portion of said wafer, and said clear-out portion has said alignment mark defined thereon.

21. The method of claim 8, wherein:

said localized portion of said wafer includes a clear-out portion of said wafer, and said clear-out portion has said alignment mark defined thereon.

22. The apparatus of claim 12, wherein:

light beams generated by said light source unit are impinged on a clear-out portion which is included in said localized portion of said first side of said wafer, and said clear-out portion has said alignment mark defined thereon.

23. The method of claim 1, further including the step of:

aligning said wafer with an alignment mechanism prior to said step of impinging light beams on said localized portion of said wafer.

24. The method of claim 8, further including the step of:

aligning said wafer with an alignment mechanism prior to said step of impinging light beams on said localized portion of said wafer.

25. The apparatus of claim 12, further comprising:

an alignment mechanism for aligning said wafer prior to said wafer being engaged by said wafer chuck.

\* \* \* \* \*